US010803383B2

(12) United States Patent
Oh et al.

(10) Patent No.: US 10,803,383 B2
(45) Date of Patent: *Oct. 13, 2020

(54) NEUROMORPHIC ARITHMETIC DEVICE

(71) Applicant: ELECTRONICS AND TELECOMMUNICATIONS RESEARCH INSTITUTE, Daejeon (KR)

(72) Inventors: Kwang Il Oh, Daejeon (KR); Sung Eun Kim, Daejeon (KR); Seong Mo Park, Daejeon (KR); Hyung-Il Park, Daejeon (KR); Joo Hyun Lee, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 477 days.

This patent is subject to a terminal disclaimer.

(21) Appl. No.: 15/828,153

(22) Filed: Nov. 30, 2017

(65) Prior Publication Data
US 2018/0211165 A1    Jul. 26, 2018

(30) Foreign Application Priority Data

Jan. 25, 2017   (KR) .................. 10-2017-0012297
Sep. 5, 2017    (KR) .................. 10-2017-0113563

(51) Int. Cl.
*G06N 3/08*     (2006.01)
*H03K 3/017*    (2006.01)
(Continued)

(52) U.S. Cl.
CPC .............. *G06N 3/08* (2013.01); *G06N 3/04* (2013.01); *G06N 3/063* (2013.01); *H03K 3/017* (2013.01); *H03K 21/026* (2013.01); *H03K 3/0315* (2013.01)

(58) Field of Classification Search
CPC .................. H03K 3/017; H03K 21/026
(Continued)

(56) References Cited

U.S. PATENT DOCUMENTS 5,845,051 A     12/1998 Oh
10,438,116 B2 * 10/2019 Oh ........................ G06F 5/01
(Continued)

FOREIGN PATENT DOCUMENTS

KR    10-1512370 B1    4/2015
KR    10-1596656 B1    2/2016
WO    WO 2015/108293 A1    7/2015

*Primary Examiner* — Tan V Mai

(57) ABSTRACT

Provided is a neuromorphic arithmetic device. The neuromorphic arithmetic device may include a synapse circuit, a metal line having an inherent capacitance component, an oscillator, a comparator, and a capacitance calibrator. The synapse circuit may be configured to perform a multiplication operation on a PWM signal and a weight to generate a current. The metal line may include a metal line capacitor in which a charge of the current is stored. The oscillator generates a plurality of pulses on the basis of the charge stored in the metal line capacitor. The comparator may compare a frequency of the plurality of pulses and a target frequency, and may generate a control signal on the basis of a result of the comparison. The capacitance calibrator may adjust a capacitance value of the metal line capacitor on the basis of the control signal.

18 Claims, 11 Drawing Sheets

(51) Int. Cl.
  *G06N 3/04* (2006.01)
  *H03K 21/02* (2006.01)
  *G06N 3/063* (2006.01)
  *H03K 3/03* (2006.01)
(58) Field of Classification Search
  USPC .......................................................... 708/835
  See application file for complete search history.

(56) References Cited

U.S. PATENT DOCUMENTS

| | | |
|---|---|---|
| 2013/0024409 A1 | 1/2013 | Hunzinger et al. |
| 2016/0078863 A1 | 3/2016 | Chung et al. |
| 2017/0255860 A1* | 9/2017 | Ritter .................. G06N 3/0635 |
| 2018/0174033 A1* | 6/2018 | Davies .................. G06N 3/049 |
| 2018/0174053 A1* | 6/2018 | Lin ........................ G06N 3/088 |

* cited by examiner

US 10,803,383 B2

NEUROMORPHIC ARITHMETIC DEVICE

CROSS-REFERENCE TO RELATED APPLICATIONS

This U.S. non-provisional patent application claims priority under 35 U.S.C. § 119 of Korean Patent Application Nos. 10-2017-0012297, filed on Jan. 25, 2017 and 10-2017-0113563, filed on Sep. 5, 2017 the entire contents of which are hereby incorporated by reference.

BACKGROUND

The present disclosure herein relates to a neuromorphic circuit, and more particularly to, a neuromorphic arithmetic device configured to correct a calculation error.

A neuromorphic arithmetic device represents a device which mimics the human nervous system or brain to process information. The neuromorphic arithmetic device includes an arithmetic block based on deep learning or machine learning related to an artificial intelligence technology and a control block for controlling the arithmetic block. The neuromorphic arithmetic device may be defined by a two-dimensional or three-dimensional connection of a plurality of neurons. Each neuron may be configured with circuits corresponding to axon, dendrite, and soma in the same manner as constituent elements of a biological neuron. In particular, an arithmetic operation is performed in a synapse circuit connecting neurons.

An analog circuit may be applied to process, quickly and in parallel, information input to the neuromorphic arithmetic device. In general, in a synapse circuit of an analog neuromorphic arithmetic device, a metal line capacitor that a metal line inherently has is used to implement a dendrite. An oscillator may generate pulses based on charges charged in the metal line capacitor, and an addition operation is performed by counting the pulses.

However, a capacitance value of the metal line capacitor may differ from a designed value. This variance is caused by a manufacturing process of the neuromorphic arithmetic device, and causes a frequency deviation of the pulses output by the oscillator. This defect causes inaccuracy in summation of results of multiplication operations performed by synapse circuits. Therefore, resolving the frequency deviation of the oscillator is a very importance issue for improving the accuracy and the reliability of the neuromorphic arithmetic device.

SUMMARY

The present disclosure provides a neuromorphic arithmetic device which corrects a calculation error caused by inaccuracy of a capacitance generated in a metal line.

An embodiment of the inventive concept provides a neuromorphic arithmetic device including: a synapse circuit configured to perform a multiplication operation on a PWM signal and a weight to generate a current; a metal line including a metal line capacitor in which a charge corresponding to the current is stored; an oscillator configured to generate a plurality of pulses on the basis of the charge stored in the metal line capacitor; and a capacitance calibrator configured to adjust a capacitance value of the metal line capacitor on the basis of a result of comparison between a frequency of the plurality of pulses and a target frequency.

In an embodiment, the capacitance calibrator may include: a plurality of capacitors connected in parallel to each other; and a plurality of switches corresponding to the plurality of capacitors respectively. Furthermore, at least part of the plurality of switches may be turned on so that the capacitance value of the metal line capacitor becomes a target value. Furthermore, the plurality of capacitors may have capacitance values which increase exponentially.

In an embodiment, the neuromorphic arithmetic device may further include: a PWM converter configured to convert an input signal into the PWM signal; a counter configured to count the plurality of pulses; a comparator configured to compare the frequency of the plurality of pulses with the target frequency; and a level shifter configured to shift a counted value counted by the counter. For example, the synapse circuit may include: a current source configured to generate the current; and an AND gate configured to perform a logic AND operation on the PWM signal and the weight, wherein the synapse circuit may output the current on the basis of an output from the AND gate. Furthermore, the metal line capacitor may correspond to an inherent capacitance of the metal line.

In an embodiment of the inventive concept, a neuromorphic arithmetic device includes: a synapse circuit configured to perform a multiplication operation on a PWM signal and a weight to generate a current; a metal line including a metal line capacitor in which a charge corresponding to the current is stored; an oscillator configured to generate a plurality of pulses on the basis of the charge stored in the metal line capacitor; and an auxiliary current source configured to adjust a magnitude of the current on the basis of a result of comparison between a frequency of the plurality of pulses and a target frequency.

In an embodiment, the auxiliary current source may include: a plurality of current sources connected in parallel to each other; and a plurality of switches corresponding to the plurality of current sources respectively. Furthermore, the synapse circuit may include: a main current source configured to generate a main current; and an AND gate configured to perform a logic AND operation on the PWM signal and the weight, wherein the synapse circuit may output currents of at least part of the plurality of current sources and the current on the basis of an output from the AND gate. Furthermore, at least part of the plurality of switches may be turned on so that the frequency of the plurality of pulses becomes the target frequency.

In an embodiment, the plurality of current sources may have current values which increase exponentially. Furthermore, the neuromorphic arithmetic device may further include: a PWM converter configured to convert an input signal into the PWM signal; a counter configured to count the plurality of pulses; a comparator configured to compare the frequency of the plurality of pulses with the target frequency; and a level shifter configured to shift a counted value counted by the counter.

In an embodiment of the inventive concept, a neuromorphic arithmetic device includes: a synapse circuit configured to perform a multiplication operation on a PWM signal and a weight to generate a current; a metal line including a metal line capacitor in which a charge corresponding to the current is stored; an oscillator configured to generate a plurality of pulses on the basis of the charge stored in the metal line capacitor; and a bias generator configured to adjust a magnitude of the current on the basis of a result of comparison between a frequency of the plurality of pulses and a target frequency.

In an embodiment, the bias generator may include: a plurality of transistors configured to receive a power supply voltage; a plurality of switches respectively corresponding to at least part of the plurality of transistors; and a reference voltage generator, wherein gates electrodes of the plurality of transistors may be connected in common to a terminal for outputting a reference voltage generated by the reference voltage generator. Furthermore, the synapse circuit may include: a current source including a transistor, a gate electrode of which is connected to the gate electrodes of the plurality of transistors; and an AND gate configured to perform a logic AND operation on the PWM signal and the weight, wherein the synapse circuit may output the current on the basis of an output from the AND gate.

In an embodiment, at least part of the plurality of switches may be turned on so that the frequency of the plurality of pulses becomes the target frequency. Furthermore, the neuromorphic arithmetic device may further include: a PWM converter configured to convert an input signal into the PWM signal; a counter configured to count the plurality of pulses; a comparator configured to compare the frequency of the plurality of pulses with the target frequency; and a level shifter configured to shift a counted value counted by the counter.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
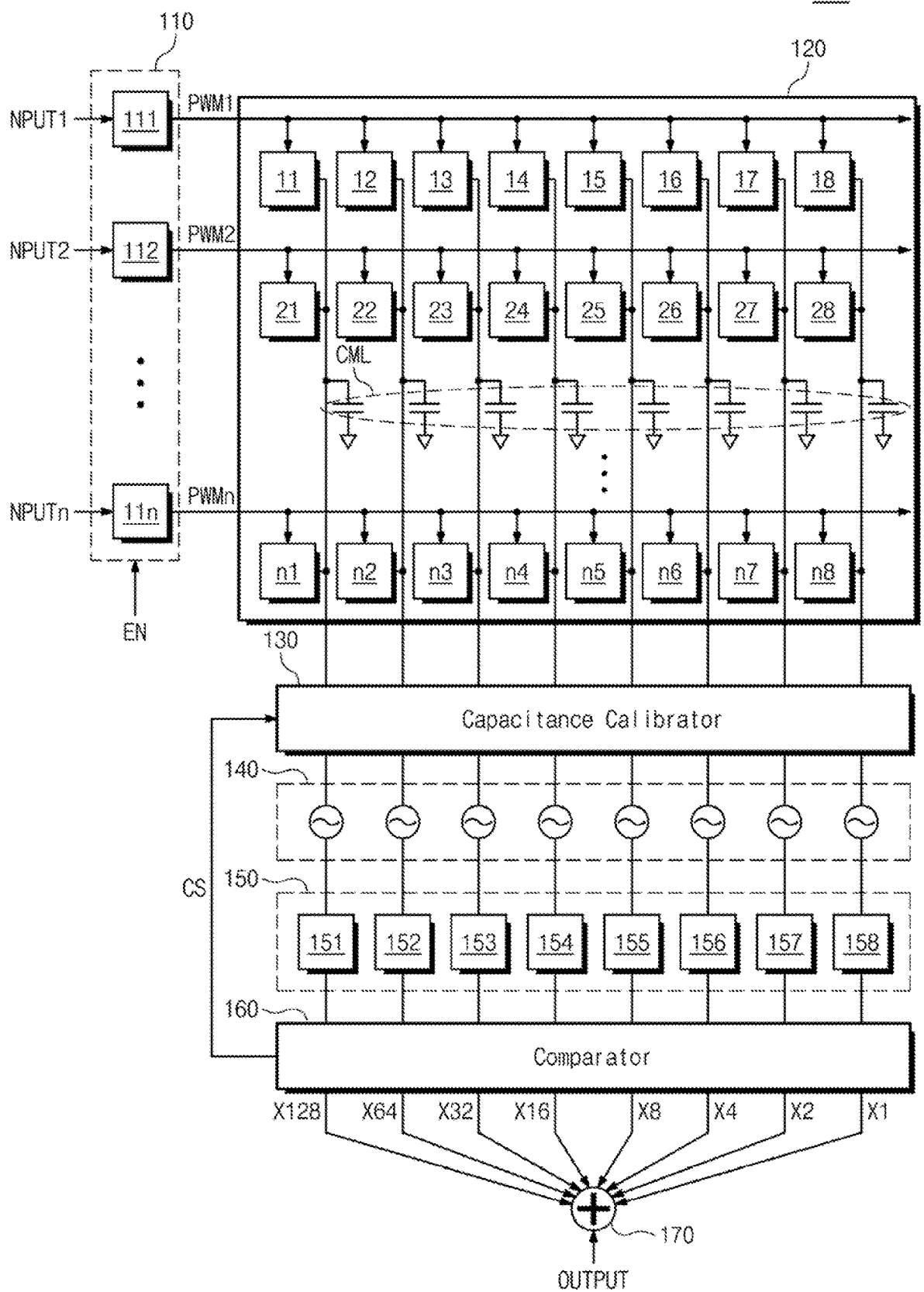
FIG. 1 is a block diagram illustrating a neuromorphic arithmetic device according to an embodiment of the inventive concept.

Hereinafter, embodiments of the inventive concept will be described in detail with reference to the accompanying drawings. In the following description, specific details such as configurations and structures are provided only to assist with an understanding of embodiments of the inventive concept. Therefore, those skilled in the art could make modifications of the embodiments of the inventive concept described herein without departing from the technical spirit and scope of the inventive concept. Descriptions of well-known functions and structures are not provided for clarity and conciseness. The terms used herein are defined in consideration of the functions of the embodiments of the inventive concept, and are not limited to specific functions. The terms may be defined based on the detailed description.

The modules illustrated in the drawings or described herein may be connected to elements other than the constituent elements illustrated in the drawings or described herein. A connection between modules or constituent elements may be direct or indirect. A connection between modules or constituent elements may be established through communication or may be a physical contact.

Constituent elements described using the terms "part", "unit", "module", "layer", etc. used herein may be implemented as hardware, software, or a combination thereof. For example, the software may be a machine code, firmware, an embedded code, or application software. For example, the hardware may include an electric circuit, an electronic circuit, a processor, a computer, an integrated circuit, integrated circuit cores, a pressure sensor, an inertial sensor, a micro electro mechanical system (MEMS), a passive element, or combinations thereof.

The terms used herein, including technical or scientific terms, have meanings that can be understood by those skilled in the art. The terms generally defined in a dictionary may be interpreted as having the same meanings as contextual meanings defined in the related art, and should not be interpreted in an idealized or overly formal sense unless otherwise defined explicitly.

FIG. 1 is a block diagram illustrating a neuromorphic arithmetic device according to an embodiment of the inventive concept. A neuromorphic arithmetic device 100 may include a plurality of pulse width modulation (PWM) converters 111 to 11n, a synapse circuit array 120 including a plurality of synapse circuits 11 to n8, a capacitance calibrator 130, oscillators 140, counters 150, a comparator 160, and an adder 170.

The plurality of PWM converters 111 to 11n may respectively receive a plurality of inputs INPUT1 to INPUTn to generate PWM signals PWM1 to PWMn. For example, the plurality of inputs INPUT1 to INPUTn may be binary values, and the plurality of PWM signals PWM1 to PWMn may correspond to the plurality of inputs INPUT1 to INPUTn respectively. That is, the PWM signals PWM1 to PWMn may have different pulse widths according to input values. Each of the PWM signals PWM1 to PWMn may have a high value at logic '1' level of a binary input, and may have a low value at logic '0' level of a binary input. For example, the PWM converters 111 to 11n may be enabled by an enable signal EN.

The synapse circuit array 120 may include the plurality of synapse circuits 11 to n8 arranged in rows and columns. The synapse circuits are exemplarily illustrated as being arranged along n number of rows and eight columns, but are not limited thereto. The plurality of synapse circuits 11 to n8 may respectively receive the plurality of PWM signals PWM1 to PWMn. For example, each of the synapse circuits 11 to 18 arranged in a first row of the synapse circuit array 120 may receive the first PWM signal PWM1. Each of the synapse circuits 21 to 28 arranged in a second row of the synapse circuit array 120 may receive the second PWM signal PWM2. The synapse circuits arranged in the other rows may receive PWM signals likewise.

Lines through which the PWM signals PWM1 to PWMn passes, respectively, may correspond to axons of nerve cells. The plurality of synapse circuits 11 to n8 may respectively receive weights W1 to Wn. Alternatively, the weights W1 to Wn may be values stored in the synapse circuits 11 to n8, respectively. For example, the PWM signals PWM1 to PWMn may be a multiplicand to be multiplied. The weights W1 to Wn may be a multiplier that is a number for multiplying another number.

Each of the plurality of synapse circuits 11 to n8 may operate as a multiplier for performing a multiplication operation. The synapse circuit array 120 may be configured to perform a plurality of multiplication operations on a plurality of multipliers and a plurality of multiplicands. For example, each of the plurality of synapse circuits 11 to n8 may include a current source, a logic gate, and a switch for performing a multiplication operation. A result of multiplication calculated by each synapse circuit may be output as a current.

Furthermore, the synapse circuits 11 to 18 arranged in the first row may be configured to perform a first multiplication operation on a first multiplicand and a first multiplier. For example, each of the synapse circuits 11 to 18 may receive the first PWM signal PWM1 as the first multiplicand. The synapse circuits 11 to 18 may receive the first multiplier. Alternatively, the first multiplier may be pre-stored in each synapse circuit.

However, each synapse circuit may receive only one bit of the first multiplier. For example, provided that the first multiplier is an 8-bit binary input, the synapse circuit 11 may store a most significant bit (MSB) of the first multiplier, and the synapse circuit 18 may store a least significant bit (LSB) of the first multiplier. The synapse circuits 12 to 17 may sequentially store the other bits between the MSB and the LSB of the first multiplier.

Each of the synapse circuits 11 to 18 may perform a partial product on the first PWM signal PWM1, which is the first multiplicand, and the first multiplier. For example, the synapse circuit 11 may perform a multiplication operation on the first PWM signal PWM1 and the most significant bit (MSB) of the first multiplier. The synapse circuit 18 may perform a multiplication operation on the first PWM signal PWM1 and the least significant bit (LSB) of the first multiplier. The other synapse circuits 12 to 17 may also perform a multiplication operation on the first PWM signal PWM1 and the other bits of the first multiplier. The above-mentioned operations may be likewise applied to the synapse circuits 21 to n8 arranged in the other rows.

A metal line capacitor inherently possessed by a metal line for connecting a plurality of synapse circuits (e.g., 11 to n1 of the first column) arranged in a single column may operate as an adder for performing an addition operation on results of multiplication operations. A capacitance component of each metal line is illustrated as a metal line capacitor CML. An addition result may correspond to a quantity of electric charge which is determined by a current output from synapse circuits and which is stored in the metal line capacitor CML of each column line.

The capacitance calibrator 130 may be configured to adjust a capacitance value of the metal line capacitor CML. A frequency deviation of the oscillators 140 may be corrected by adjusting the capacitance value to an original target capacitance value of the metal line capacitor. For example, the capacitance calibrator 130 may include a plurality of capacitors. A configuration and detailed operation of the capacitance calibrator 130 is described below in detail with reference to FIG. 4.

The oscillators 140 may include a plurality of oscillators, each of which is connected to a single metal line. Each oscillator may generate pulses on the basis of charges stored in the metal line capacitor CML. Since the charges stored in the metal line capacitor CML correspond to the result of the addition operation performed on the results of the multiplication operations performed by the plurality of synapse circuits, the pulses generated by each oscillator may correspond to the result of the addition operation.

The counters 150 may count the pulses generated by the plurality of oscillators 140. For example, the counters 150 may include a plurality of counters 151 to 158 respectively connected to the metal lines.

The comparator 160 may compare a counted value counted by each counter with an originally intended counted value. For example, the metal line capacitor CML of a first metal line may not have a capacitance value that was originally intended when designed. In this case, since the frequency of the pulses generated by each oscillator does not have an originally intended value, an accurate result of the addition operation is not achieved. Therefore, the comparator 160 generates a control signal CS for controlling the capacitance calibrator 130 on the basis of a result of the comparison. Operation of the comparator 160 is described below in detail with reference to FIG. 4.

The adder 170 may add shifted digital values, and may output an addition result OUTPUT. The adder 170 may be configured with various logic elements capable of adding a plurality of digital values and outputting a result of the addition.

However, the digital values output from the counters 150 have been obtained without considering an order number of a bit for a partial product that has been performed on a multiplier and a multiplicand. Therefore, appropriate shifting (or level shifting) is required to be performed on the digital values output from the counters 150 in order to obtain a complete operation result.

For example, the digital value output from the counter 151 is a sum of results of partial products of MSBs of multipliers and multiplicands. Therefore, the digital value output from the counter 151 is required to be multiplied by $2^7$ (i.e., 128). For example, the digital value output from the counter 158 is a sum of results of partial products of LSBs of multipliers and multiplicands. Therefore, the digital value output from the counter 158 is required to be multiplied by $2^0$ (i.e., 1). The digital values output from the other counters 152 to 157 are also required to be shifted in this manner. This shifting may be performed by, for example, a level shifter (not shown) or the like.

According to the above-mentioned embodiment, the counted value of the pulses generated by each oscillator may be compared with the originally intended counted value. Furthermore, the capacitance calibrator 130 may be controlled on the basis of the result of the comparison so that the metal capacitance value of each metal line becomes an original target value. As a result, the frequency of the pulses output from the oscillators 140 may have an original target value. Accordingly, a neuromorphic arithmetic circuit configured to accurately perform a multiplication operation and an addition operation may be provided.

Figure 2:
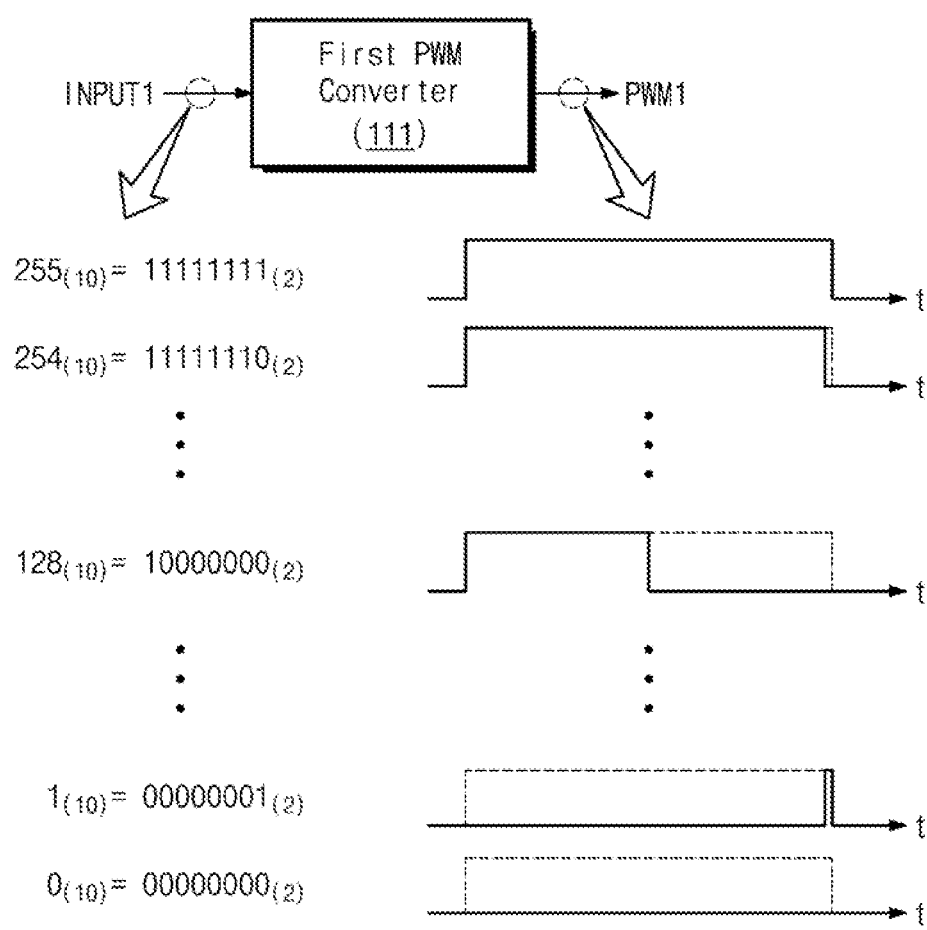
FIG. 2 is a diagram illustrating operation of the PWM converters illustrated in FIG. 1.

FIG. 2 is a diagram illustrating operation of the PWM converters illustrated in FIG. 1. Operation of the first PWM converter 111 amongst the plurality of converters 111 to 11*n* is exemplarily illustrated, and the configuration and operation of the other converters 112 to 11n are substantially the same as those of the first PWM converter 111.

The first PWM converter 111 may receive the first input INPUT1 to generate the first PWM signal PWM1. The first input INPUT1 is exemplarily illustrated as an 8-bit binary number. Binary numbers input to the first PWM converter 111 and waveforms of PWM signals output from the first PWM converter 111 are exemplarily illustrated. For example, in a logic high period of a binary number input to the first PWM converter 111, bit '1' may be output, and in a logic low period of the binary number, bit '0' may be output.

Figure 3:
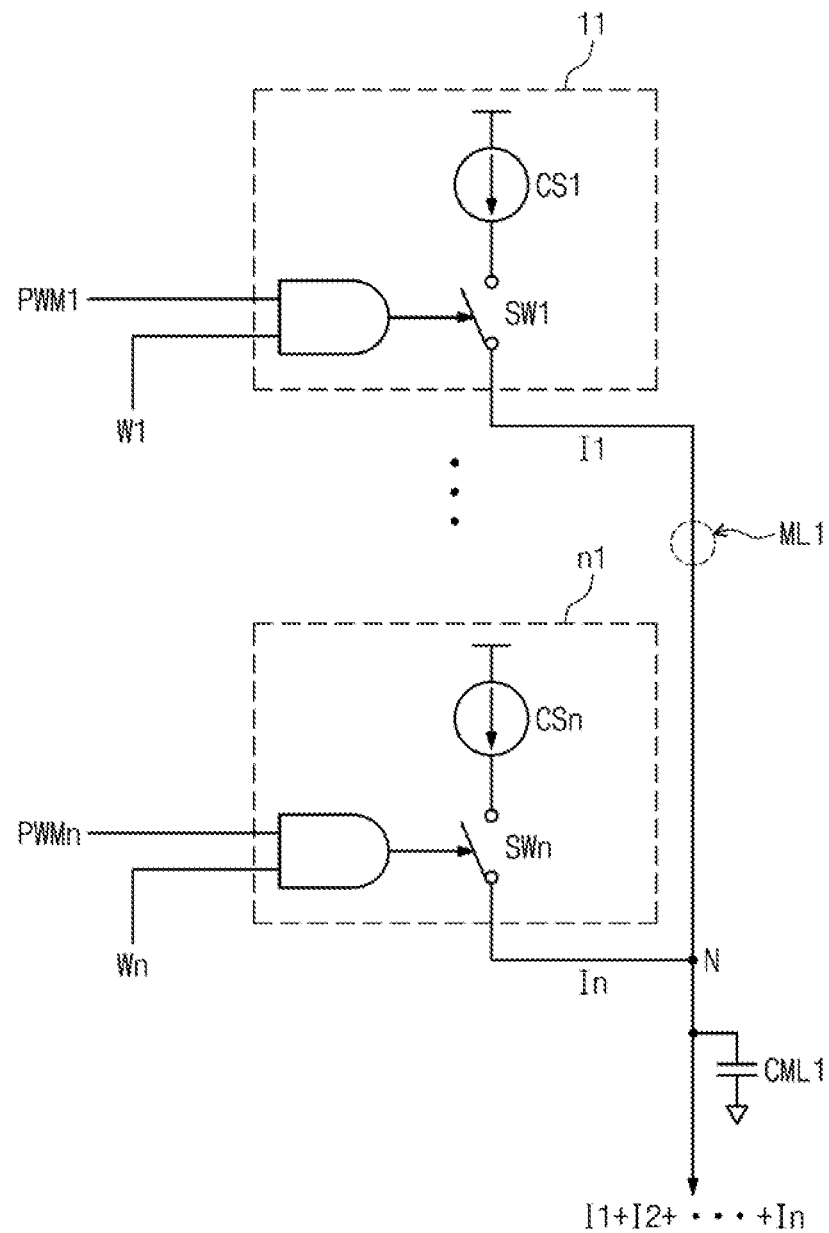
FIG. 3 is a block diagram exemplarily illustrating the synapse circuits illustrated in FIG. 1.

FIG. 3 is a block diagram exemplarily illustrating the synapse circuits illustrated in FIG. 1. For simple illustration, only the first and nth synapse circuits 11 and n1 connected to a first metal line ML1, amongst the synapse circuits 11 to n1, are illustrated. The first synapse circuit 11 may include an AND gate, a first current source CS1, and a first switch SW1. The nth synapse circuit n1 may include an AND gate, an nth current source CSn, and an nth switch SWn.

The AND gates of the synapse circuits 11 to n1 may receive the PWM signals PWM1 to PWMn generated by the PWM converters 111 to 11n (see FIG. 1), respectively. For example, the PWM signals PWM1 to PWMn may be a multiplicand that is a number to be multiplied. The weights W1 to Wn may be respectively input to the AND gates of the synapse circuits 11 to n1. For example, the weights W1 to Wn may be a multiplier that is a number for multiplying another number. For example, the weights W1 to Wn may be externally input, or may be stored in advance in the synapse circuits 11 to n1.

The synapse circuits 11 to n1 may perform a plurality of multiplication operations. For example, the first synapse circuit 11 connected to the first metal line ML1 may perform a first multiplication operation on the multiplier PWM1 and the multiplicand W1. Likewise, the nth synapse circuit n1 connected to the first metal line ML1 may perform an nth multiplication operation on the multiplier PWMn and the multiplicand Wn. Here, a result of the first multiplication may be indicated by a current I1, and a result of the nth multiplication operation may be indicated by a current In. As a result, a sum of the results of the first to nth multiplication operations may be indicated by a sum of the currents I1 to In.

Each of the switches SW1 to SWn may be switched-on or switched-off according to a result of an operation performed by the AND gate provided to each of the synapse circuits 11 to n1. For example, when the result of the operation performed by the AND gate is logic '1', the switch may be switched on, or when the result of the operation performed by the AND gate is logic '0', the switch may be switched off. As the switches SW1 to SWn are switched on, currents generated by the current sources CS1 to CSn may flow through the first metal line ML1.

The current sources CS1 to CSn may be configured such that a voltage level by charges stored in the first metal line capacitor CML1 increases linearly. In general, when a storage element such as a capacitor is charged, the difference of a voltage levels on both ends of the capacitor increases nonlinearly. Therefore, if the linearity of the first metal line capacitor CML1 is not guaranteed, the sum of the currents I1 to In may not indicate the sum of the results of the first to nth multiplication operations. However, since the current sources CS1 to CSn are configured to guarantee the linearity of the metal line capacitor CML, the sum of the results of the first to nth multiplication operations may indicate the sum of the currents I1 to In.

Figure 4:
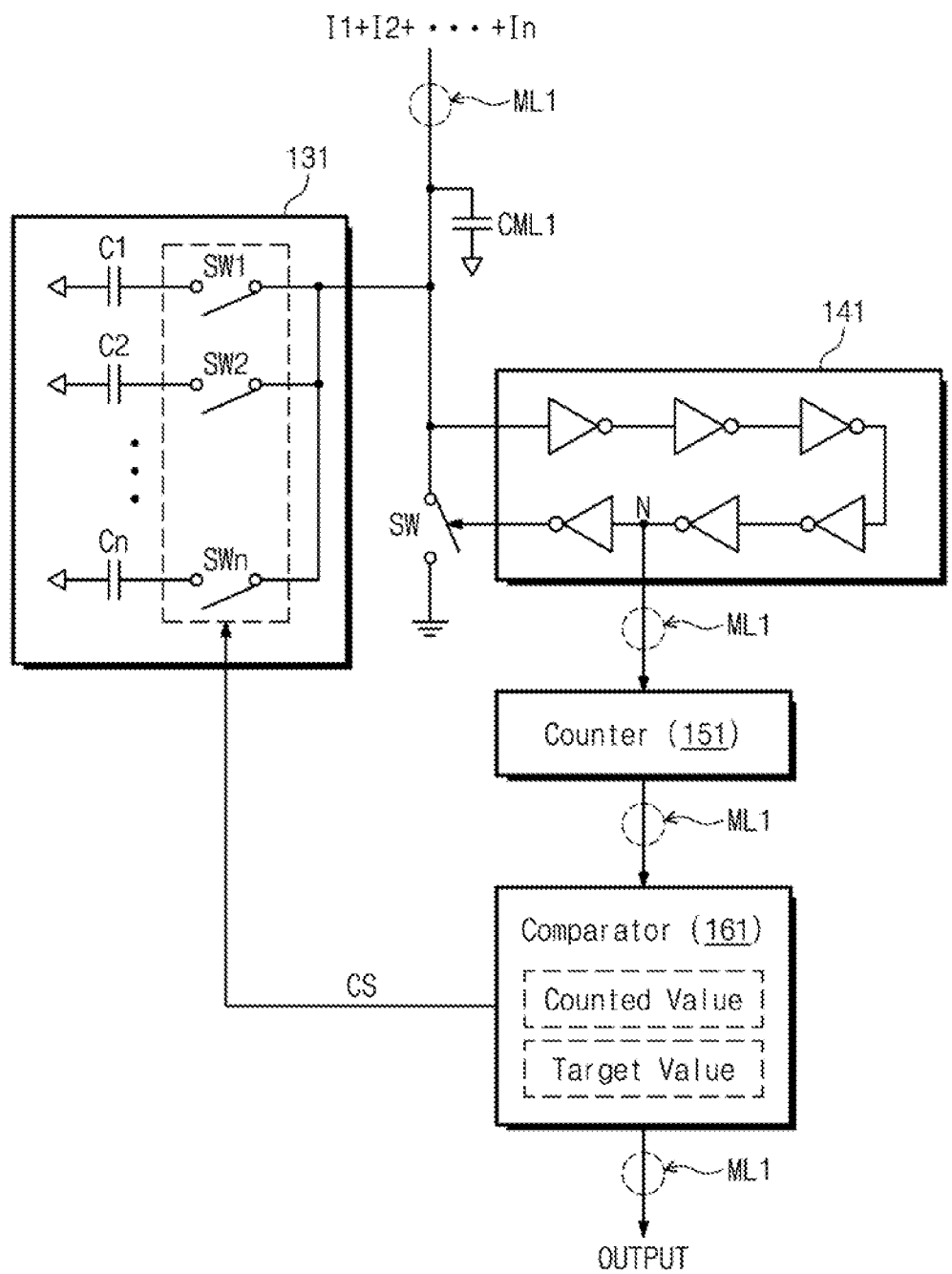
FIG. 4 is a block diagram exemplarily illustrating some elements of the neuromorphic arithmetic circuit illustrated in FIG. 1.

FIG. 4 is a block diagram exemplarily illustrating some elements of the neuromorphic arithmetic circuit illustrated in FIG. 1. FIG. 4 illustrates exemplary configurations of a capacitance calibrator 131, an oscillator 141, the counter 151, and a comparator 161. The calibrator 131 represents a calibrator connected to the first metal line ML1 amongst the calibrators 130 of FIG. 1. The oscillator 141 represents an oscillator connected to the first metal line ML1 amongst the oscillators 140 of FIG. 1. The first metal line capacitor CML1 represents an inherent capacitance component of the first metal line ML1. For simplicity and ease of description, FIGS. 1 to 3 are also referred to below.

The results of the multiplication operations performed by the neuromorphic synapse circuits 11 to n1 connected to the first metal line ML1 may be represented by a sum of currents I1+I2+ . . . +In. Charges of the sum of currents I1+I2+ . . . +In may be stored in the first metal line capacitor CML1.

The capacitance calibrator 131 may include a plurality of capacitors configured to obtain a capacitance value of the first metal line capacitor CML1 which was originally intended when designing the neuromorphic arithmetic circuit. For example, the capacitance calibrator 131 may include a plurality of capacitors C1 to Cn connected in parallel and a plurality of switches SW1 to SWn. Although the capacitors C1 to Cn are exemplarily illustrated as being connected in parallel, the capacitors may be connected in series or in series and parallel combination.

The capacitance calibrator 131 may be appropriately switched on in response to the control signal CS. An originally intended capacitance value may be obtained by virtue of switched-on capacitor(s) amongst the plurality of capacitors C1 to Cn and the first metal line capacitor CML1. For example, the capacitance value of the first metal line capacitor CML1 may be designed to be smaller than the originally intended capacitance value.

The oscillator 141 may be configured to generate pulses according to a change of charge stored in the first metal line capacitor CML1. For example, the oscillator 141 may include a plurality of inverting amplifiers (or inverters). An output of the oscillator 141 implemented as a ring oscillator may turn on or off a switch SW. As a result, the first metal line capacitor CML1 may be repeatedly charged and discharged so that pulses may be generated. However, the configuration of the oscillator 141 illustrated in FIG. 4 is merely exemplary, and is not limited thereto.

The counter 151 may count the pulses output from the oscillator 141. As the first metal line capacitor CML1 is repeatedly charged and discharged, the pulses may be output through a node N. The counter 151 may transfer a counted value to the comparator 161 (for example, during a reference period).

The comparator 161 may compare the counted value with a target value. For example, the target value may correspond to an inherent capacitance value of the first metal line ML1 which was originally intended when designing the neuromorphic arithmetic device. However, the originally intended capacitance value of the first metal line ML1 may differ from an actually measured value due to process variation, etc. The comparator 161 may generate, on the basis of a result of the comparison, the control signal CS for controlling the switches SW1 to SWn in order to obtain a capacitance value that matches the counted value to the target value.

According to a typical neuromorphic arithmetic circuit, due to the difference between an intended capacitance value of a metal line capacitor and an actual capacitance value thereof, a sum of results of multiplication operations performed by a plurality of synapse circuit may not be accurately calculated. However, according to an embodiment of the inventive concept, a capacitance calibrator is provided to obtain a desired metal line capacitance value, so that the accuracy of an addition operation may be improved.

Figure 5:
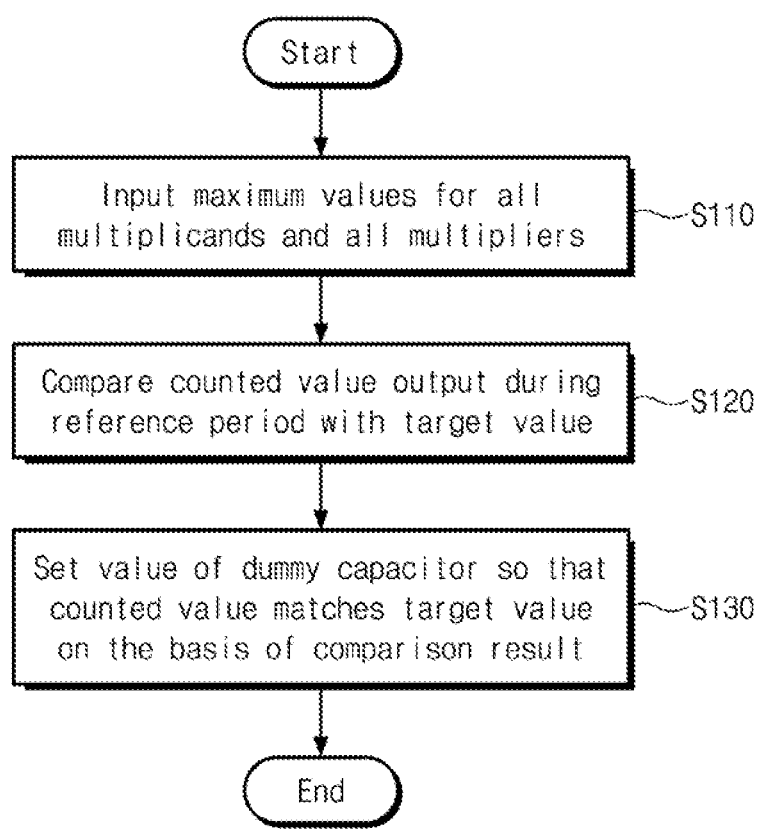
FIG. 5 is a flowchart illustrating a method for correcting a frequency deviation of an oscillator according to an embodiment of the inventive concept.

FIG. 5 is a flowchart illustrating a method for correcting a frequency deviation of an oscillator according to an embodiment of the inventive concept. For simplicity and ease of description, FIGS. 1 to 4 are also referred to below.

In operation S110, maximum values may be input for all multiplicands and all multipliers. For example, the multiplicands may be the PWM signals PWM1 to PWMn input to the synapse circuits 11 to n8, and the multipliers may be weights input to (or stored in) the synapse circuits 11 to n8. Although the maximum values are described as being input for all multiplicands and all multipliers in order to facilitate counting by a counter, an embodiment of the inventive concept is not limited thereto.

In operation S120, a counted value output during a reference period may be compared with a target value. For example, the target value may be the capacitance value of a metal line which was originally intended when designing a neuromorphic synapse circuit.

In operation S130, a capacitance value (illustrated as dummy capacitor in FIG. 4) that matches the counted value to the target value may be set on the basis of a result of the comparison between the counted value and the target value. For example, a desired capacitance value may be obtained together with the capacitance value of the first metal line capacitor CML1 by appropriately switching on some of the plurality of capacitors included in the capacitance calibrator 131 of FIG. 4.

Figure 6:
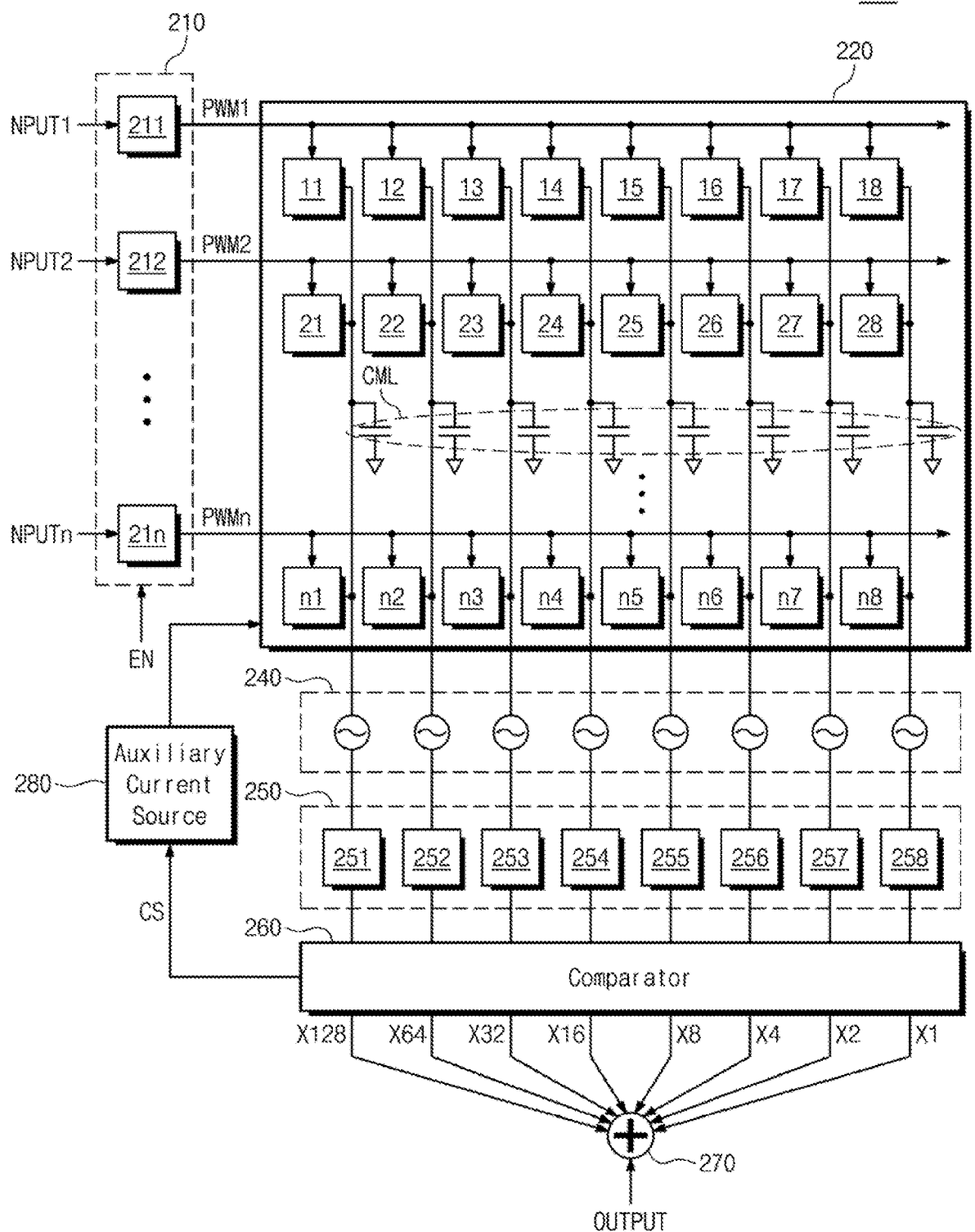
FIG. 6 is a block diagram illustrating a neuromorphic arithmetic device according to an embodiment of the inventive concept.

FIG. 6 is a block diagram illustrating a neuromorphic arithmetic device according to an embodiment of the inventive concept. A neuromorphic arithmetic device 200 may include a plurality of PWM converters 211 to 21n, a synapse circuit array 220 including a plurality of synapse circuits 11 to n8, oscillators 240, counters 250, a comparator 260, an adder 270, and an auxiliary current source 280.

The elements of the neuromorphic arithmetic device 200 of the present embodiments, excepting the auxiliary current source 280, are substantially the same as or similar to the elements described above with reference to FIGS. 1 to 5. Therefore, overlapping descriptions are omitted.

The comparator 260 may compare a counted value counted by each counter with an originally intended counted value. For example, the metal line capacitor CIVIL of a first metal line may not have a capacitance value that was originally intended when designed. In this case, since the frequency of the pulses generated by each oscillator does not have an originally intended value, an accurate result of an addition operation is not achieved. Therefore, the comparator 260 generates a control signal CS for controlling the auxiliary current source 280 on the basis of a result of the comparison.

The auxiliary current source 260 may be configured to adjust a magnitude of a current generated by each of the synapse circuits 11 to n8 on the basis of the control signal CS. For example, the auxiliary current source 260 may include a plurality of current sources so that each of the synapse circuits 11 to n8 generates currents with various magnitudes. Each of the plurality of current sources may be selectively provided on the basis of the control signal CS.

Since the current sources of the auxiliary current source 260 are appropriately selectively provided, a current amount provided to the metal line capacitor CML may be appropriately variable. Therefore, since the frequency of the oscillator 240 varies with the magnitude of a variable current, a frequency counted number that was originally intended when designing the neuromorphic arithmetic circuit may be obtained.

Figure 7:
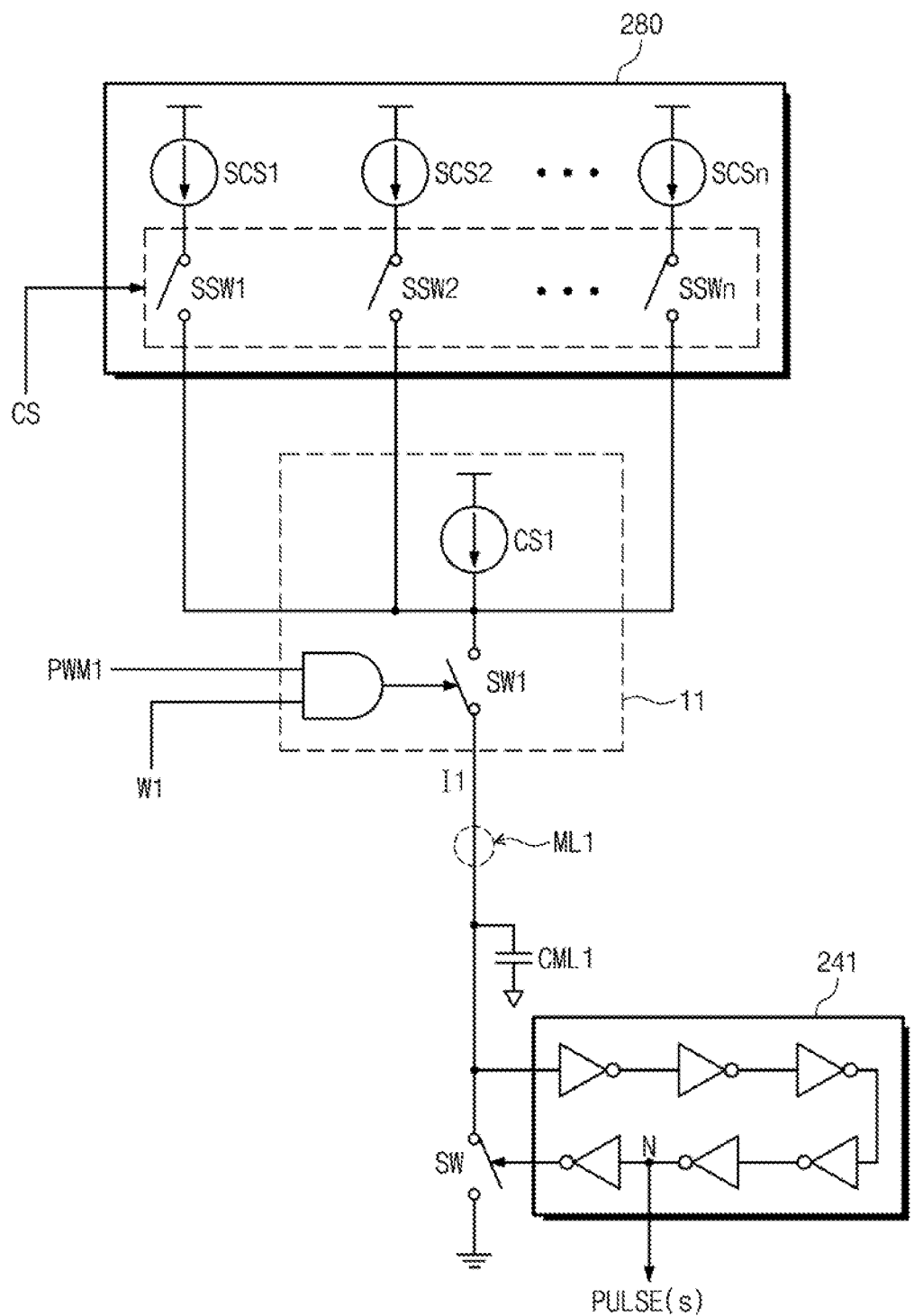
FIG. 7 is a block diagram exemplarily illustrating some elements of the neuromorphic arithmetic circuit illustrated in FIG. 6.

FIG. 7 is a block diagram exemplarily illustrating some elements of the neuromorphic arithmetic circuit illustrated in FIG. 6. FIG. 7 illustrates the synapse circuit 11 connected to the first metal line ML1, an oscillator 241, and the auxiliary current source 280. The first metal line capacitor CML1 represents an inherent capacitance component of the first metal line ML1. For simplicity and ease of description, FIG. 6 is also referred to below.

The auxiliary current source 280 may include a plurality of auxiliary current sources SCS1 to SCSn. For example, a plurality of auxiliary switches SSW1 to SSWn may be provided so that each of the plurality of auxiliary current sources SCS1 to SCSn may be selectively provided to the synapse circuit 11.

For example, the plurality of auxiliary current sources SCS1 to SCSn may be configured to generate auxiliary currents having the same magnitude or auxiliary currents having different magnitudes. For example, in the case where the plurality of auxiliary current sources SCS1 to SCSn are configured to generate auxiliary currents having different magnitudes, the magnitude of a current generated by each of the plurality of auxiliary current sources SCS1 to SCSn may increase exponentially.

In addition to a current (generated by CS1) provided by default to the synapse circuit 11, at least part of the plurality of auxiliary current sources SCS1 to SCSn is provided, so that the magnitude of a current I1 output from the synapse circuit 11 may increase or decrease. As a result, since the frequency of pulses generated by the oscillator 241 changes due to the increased or decreased magnitude of the current I1, a desired counted value may be obtained.

Figure 8:
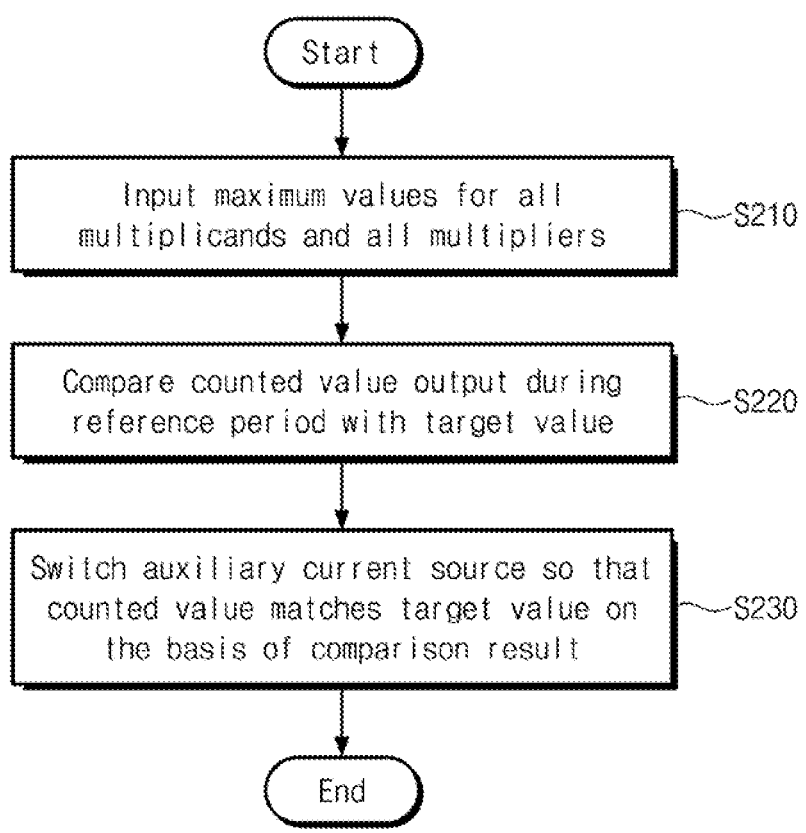
FIG. 8 is a flowchart illustrating a method for correcting a frequency deviation of an oscillator according to an embodiment of the inventive concept.

FIG. 8 is a flowchart illustrating a method for correcting a frequency deviation of an oscillator according to an embodiment of the inventive concept. For simplicity and ease of description, FIGS. 6 and 7 are also referred to below.

In operation S210, maximum values may be input for all multiplicands and all multipliers. For example, the multiplicands may be the PWM signals PWM1 to PWMn input to the synapse circuits 11 to n8, and the multipliers may be weights input to (or stored in) the synapse circuits 11 to n8. Although the maximum values are described as being input for all multiplicands and all multipliers in order to facilitate counting by a counter, an embodiment of the inventive concept is not limited thereto.

In operation S220, a counted value output during a reference period may be compared with a target value. For example, the target value may be the capacitance value of a metal line which was originally intended when designing a neuromorphic synapse circuit.

In operation S230, the magnitude of the current I1 that matches the counted value to the target value may be set on the basis of a result of the comparison between the counted value and the target value. For example, as at least part of the auxiliary switches SSW1 to SSWn of FIG. 7 is appropriately turned on, at least part of currents generated by the current source SC1 and the auxiliary current sources SCS1 to SCSn may be output from the synapse circuit 11. As a result, the oscillator 241 may output pulses having a target frequency that was originally intended when designing the neuromorphic synapse circuit.

Figure 9:
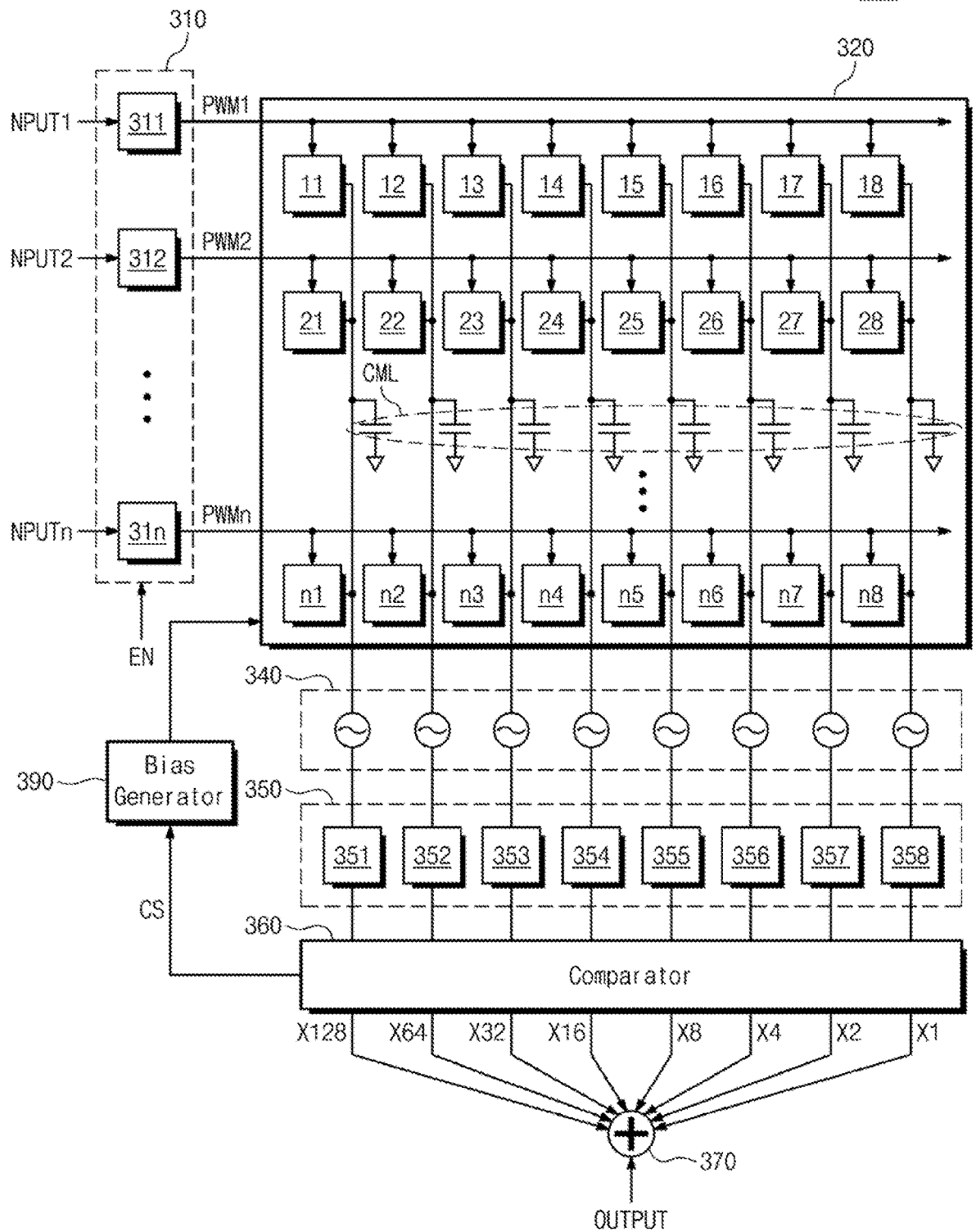
FIG. 9 is a block diagram illustrating a neuromorphic arithmetic device according to an embodiment of the inventive concept.

FIG. 9 is a block diagram illustrating a neuromorphic arithmetic device according to an embodiment of the inventive concept. A neuromorphic arithmetic device 300 may include a plurality of PWM converters 311 to 31n, a synapse circuit array 320 including a plurality of synapse circuits 11 to n8, oscillators 340, counters 350, a comparator 360, an adder 370, and a bias generator 390.

The elements of the neuromorphic arithmetic device 300 of the present embodiments, excepting the bias generator 390, are substantially the same as or similar to the elements described above with reference to FIGS. 1 to 6. Therefore, overlapping descriptions are omitted.

The comparator 360 may compare a counted value counted by each counter with an originally intended counted value. For example, the metal line capacitor CML of a first metal line may not have a capacitance value that was originally intended when designed. In this case, since the frequency of the pulses generated by each oscillator does not have an originally intended value, an accurate result of an addition operation is not achieved. Therefore, the comparator 360 generates a control signal CS for controlling the bias generator 390 on the basis of a result of the comparison.

The bias generator 390 may assist each of the plurality of synapse circuits I1 to n8 in generating a current of a certain level. For example, the bias generator 390 may be implemented as a current mirror for reflecting a current generated by the bias generator 390 to the current generated by each of the synapse circuits 11 to n8.

Since a reference current generated by the bias generator 390 is reflected to the current generated by each synapse circuit, a current amount provided to the metal line capacitor CML may be appropriately variable. Therefore, since the frequency of the oscillator 340 varies with the magnitude of a variable current, a frequency counted number that was originally intended when designing the neuromorphic arithmetic circuit may be obtained.

Figure 10:
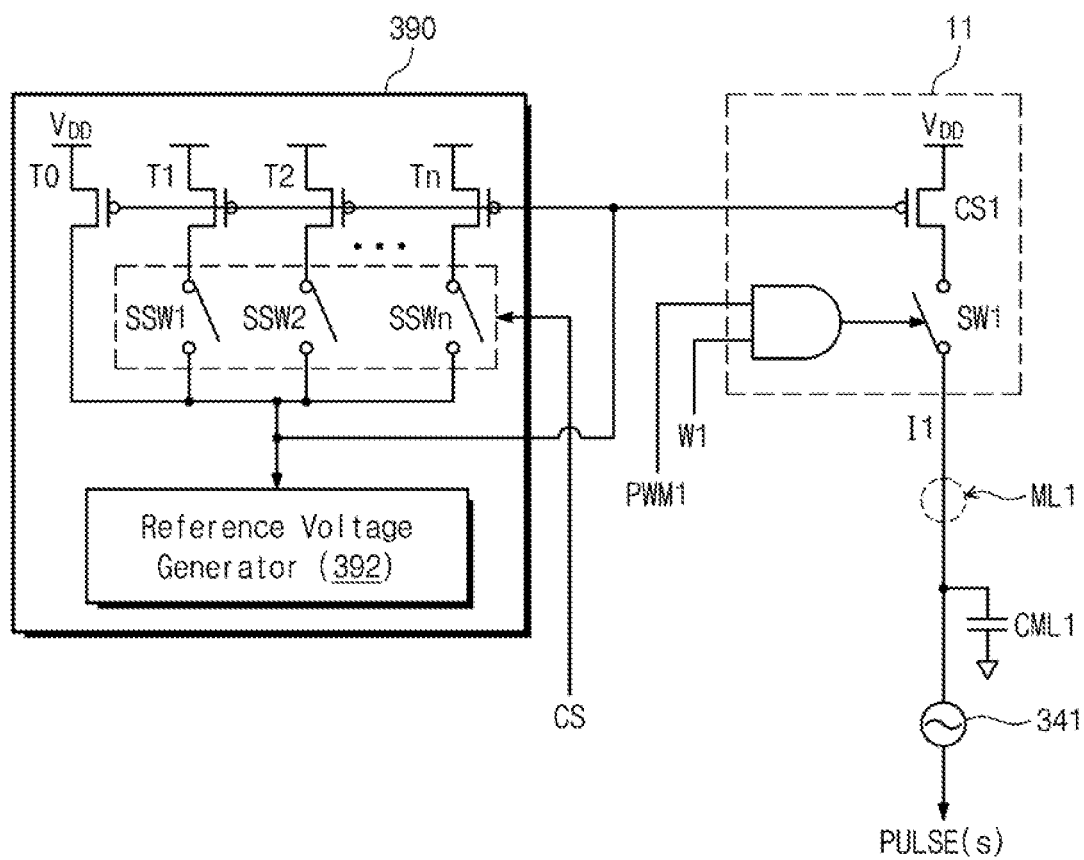
FIG. 10 is a block diagram exemplarily illustrating some elements of the neuromorphic arithmetic circuit illustrated in FIG. 9.

FIG. 10 is a block diagram exemplarily illustrating some elements of the neuromorphic arithmetic circuit illustrated in FIG. 9. FIG. 9 illustrates the synapse circuit 11 connected to the first metal line ML1, an oscillator 341, and the bias generator 390. The first metal line capacitor CML1 represents an inherent capacitance component of the first metal line ML1. For simplicity and ease of description, FIG. 9 is also referred to below.

The bias generator 390 may be configured to adjust a level of the current I1 output from the synapse circuit 11. For example, as the bias generator 390 is controlled in response to the control signal CS, the magnitude of the current I1 may increase or decrease. For example, the bias generator 390 may be implemented as a current mirror configured to change the magnitude of the current I1 according to the magnitude of a current generated in the bias generator 390.

In the case where the bias generator 390 is implemented as a current mirror, the bias generator 390 may include a plurality of transistors T0 to Tn supplied with a power supply voltage VDD, a plurality of auxiliary switches SSW1 to SSWn turned on or off in response to the control signal CS, and a reference voltage generator 392. Gate electrodes of the plurality of transistors T0 to Tn may be connected in common to a terminal for outputting the reference voltage generated by the reference voltage generator 392 and a gate electrode of a PMOS transistor included in the current source CS1. The plurality of transistors T1 to Tn may have the same size to output currents with the same magnitude. Alternatively, the plurality of transistors T1 to Tn may have different sizes so that the magnitudes of the currents output therefrom increase exponentially.

The reference voltage generator 392 may be configured to generate a bias voltage of a certain level. For example, the reference voltage generator 392 may be configured as a band gap reference circuit so as not to be affected by variation of a semiconductor manufacturing process. For example, since the PMOS transistor of the current source CS1 is turned on by voltage (or current) generated by the reference voltage generator 392, the magnitude of the current I1 output from the PMOS transistor of the current source CS1 may be controlled when the magnitude of a reference current Iref is controlled.

Since the bias generator 390 for changing the magnitude of the current I1 output from the synapse circuit 11 is provided, the frequency of the pulses generated by the oscillator 341 may be set to a desired frequency. Since a configuration and operation of the oscillator 341 are the same as or similar to those of the oscillators 141 and 241 illustrated in FIGS. 4 and 7, the oscillator 341 is not described in detail. As a result, a desired counted value counted by a counter (e.g., the counter 351 of FIG. 9) may be obtained.

Figure 11:
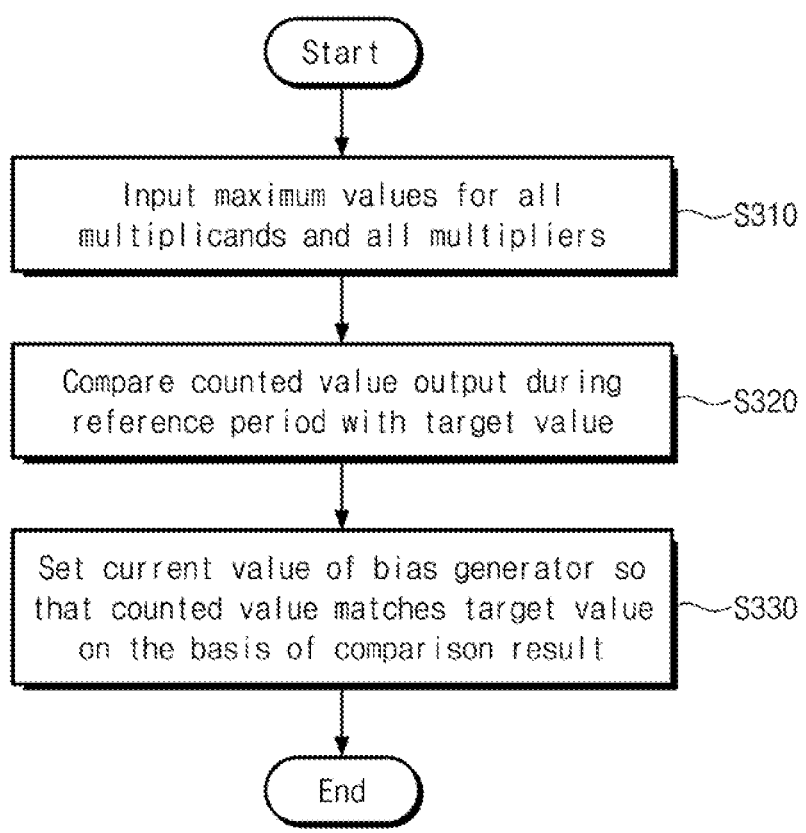
FIG. 11 is a flowchart illustrating a method for correcting a frequency deviation of an oscillator according to an embodiment of the inventive concept.

FIG. 11 is a flowchart illustrating a method for correcting a frequency deviation of an oscillator according to an embodiment of the inventive concept. For simplicity and ease of description, FIGS. 9 and 10 are also referred to below.

In operation S310, maximum values may be input for all multiplicands and all multipliers. For example, the multiplicands may be the PWM signals PWM1 to PWMn input to the synapse circuits 11 to n8, and the multipliers may be weights input to (or stored in) the synapse circuits 11 to n8. Although the maximum values are described as being input for all multiplicands and all multipliers in order to facilitate counting by a counter, an embodiment of the inventive concept is not limited thereto.

In operation S320, a counted value output during a reference period may be compared with a target value. For example, the target value may be the capacitance value of a metal line which was originally intended when designing a neuromorphic synapse circuit.

In operation S330, the magnitude of the current Iref that matches the counted value to the target value may be set on the basis of a result of the comparison between the counted value and the target value. For example, as at least part of the auxiliary switches SSW1 to SSWn of FIG. 10 is appropriately turned on, the magnitude of the current output from the PMOS transistor of the current source SC1 may be controlled. As a result, the oscillator 341 may output pulses having a target frequency that was originally intended when designing the neuromorphic synapse circuit.

According to an embodiment of the inventive concept, the frequency deviation of an oscillator may be corrected by adjusting a capacitance value of a capacitor.

According to another embodiment of the inventive concept, the frequency deviation of an oscillator may be corrected by providing an auxiliary current source to a synapse circuit.

According to another embodiment of the inventive concept, the frequency deviation of an oscillator may be corrected by adjusting a current of a synapse circuit using a bias generator.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A neuromorphic arithmetic device comprising:
   a synapse circuit configured to perform a multiplication operation on a PWM signal and a weight to generate a current;
   a metal line comprising a metal line capacitor in which a charge corresponding to the current is stored;
   an oscillator configured to generate a plurality of pulses on the basis of the charge stored in the metal line capacitor; and
   a capacitance calibrator configured to adjust a capacitance value of the metal line capacitor on the basis of a result of comparison between a frequency of the plurality of pulses and a target frequency.

2. The neuromorphic arithmetic device of claim 1, wherein the capacitance calibrator comprises:
   a plurality of capacitors connected in parallel to each other; and
   a plurality of switches corresponding to the plurality of capacitors respectively.

3. The neuromorphic arithmetic device of claim 2, wherein at least part of the plurality of switches is turned on so that the capacitance value of the metal line capacitor becomes a target value.

4. The neuromorphic arithmetic device of claim 3, wherein the plurality of capacitors have capacitance values which increase exponentially.

5. The neuromorphic arithmetic device of claim 1, further comprising:
   a PWM converter configured to convert an input signal into the PWM signal;
   a counter configured to count the plurality of pulses;
   a comparator configured to compare the frequency of the plurality of pulses with the target frequency; and
   a level shifter configured to shift a counted value counted by the counter.

6. The neuromorphic arithmetic device of claim 1, wherein the synapse circuit comprises:
   a current source configured to generate the current; and
   an AND gate configured to perform a logic AND operation on the PWM signal and the weight,
   wherein the synapse circuit outputs the current on the basis of an output from the AND gate.

7. The neuromorphic arithmetic device of claim 1, wherein the metal line capacitor corresponds to an inherent capacitance of the metal line.

8. A neuromorphic arithmetic device comprising:
   a synapse circuit configured to perform a multiplication operation on a PWM signal and a weight to generate a current;
   a metal line comprising a metal line capacitor in which a charge corresponding to the current is stored;
   an oscillator configured to generate a plurality of pulses on the basis of the charge stored in the metal line capacitor; and
   an auxiliary current source configured to adjust a magnitude of the current on the basis of a result of comparison between a frequency of the plurality of pulses and a target frequency.

9. The neuromorphic arithmetic device of claim 8, wherein the auxiliary current source comprises:
   a plurality of current sources connected in parallel to each other; and
   a plurality of switches corresponding to the plurality of current sources respectively.

10. The neuromorphic arithmetic device of claim 9, wherein the synapse circuit comprises:
    a main current source configured to generate a main current; and
    an AND gate configured to perform a logic AND operation on the PWM signal and the weight,
    wherein the synapse circuit outputs currents of at least part of the plurality of current sources and the current on the basis of an output from the AND gate.

11. The neuromorphic arithmetic device of claim 9, wherein at least part of the plurality of switches is turned on so that the frequency of the plurality of pulses becomes the target frequency.

12. The neuromorphic arithmetic device of claim 9, wherein the plurality of current sources have current values which increase exponentially.

13. The neuromorphic arithmetic device of claim 8, further comprising:
    a PWM converter configured to convert an input signal into the PWM signal;
    a counter configured to count the plurality of pulses;
    a comparator configured to compare the frequency of the plurality of pulses with the target frequency; and
    a level shifter configured to shift a counted value counted by the counter.

14. A neuromorphic arithmetic device comprising:
    a synapse circuit configured to perform a multiplication operation on a PWM signal and a weight to generate a current;
    a metal line comprising a metal line capacitor in which a charge corresponding to the current is stored;
    an oscillator configured to generate a plurality of pulses on the basis of the charge stored in the metal line capacitor; and
    a bias generator configured to adjust a magnitude of the current on the basis of a result of comparison between a frequency of the plurality of pulses and a target frequency.

15. The neuromorphic arithmetic device of claim 14, wherein the bias generator comprises:
    a plurality of transistors configured to receive a power supply voltage;
    a plurality of switches respectively corresponding to at least part of the plurality of transistors; and
    a reference voltage generator,
    wherein gates electrodes of the plurality of transistors are connected in common to a terminal for outputting a reference voltage generated by the reference voltage generator.

16. The neuromorphic arithmetic device of claim 15, wherein the synapse circuit comprises:
    a current source comprising a transistor, a gate electrode of which is connected to the gate electrodes of the plurality of transistors; and
    an AND gate configured to perform a logic AND operation on the PWM signal and the weight,
    wherein the synapse circuit outputs the current on the basis of an output from the AND gate.

17. The neuromorphic arithmetic device of claim 15, wherein at least part of the plurality of switches is turned on so that the frequency of the plurality of pulses becomes the target frequency.

18. The neuromorphic arithmetic device of claim 14, further comprising:
    a PWM converter configured to convert an input signal into the PWM signal;
    a counter configured to count the plurality of pulses;
    a comparator configured to compare the frequency of the plurality of pulses with the target frequency; and
    a level shifter configured to shift a counted value counted by the counter.

* * * * *